US007458413B2

(12) United States Patent
Mok

(10) Patent No.: US 7,458,413 B2
(45) Date of Patent: Dec. 2, 2008

(54) SEMICONDUCTOR CHIP HEAT TRANSFER DEVICE

(75) Inventor: Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 520 days.

(21) Appl. No.: 10/988,219

(22) Filed: Nov. 12, 2004

(65) Prior Publication Data

US 2006/0102318 A1 May 18, 2006

(51) Int. Cl.
*F22B 37/00* (2006.01)

(52) U.S. Cl. ................ 165/11.1; 165/80.2; 165/104.26; 165/104.33; 165/122; 361/699

(58) Field of Classification Search ................ 165/11.1, 165/80.1, 80.2, 80.3, 80.4, 80.5, 104.26, 165/120, 121, 122, 104.33; 361/699
See application file for complete search history.

(56) References Cited

U.S. PATENT DOCUMENTS

| | | | | |
|---|---|---|---|---|
| 6,029,742 | A * | 2/2000 | Burward-Hoy | 165/80.4 |
| 6,152,213 | A * | 11/2000 | Suzuki | 165/104.33 |
| 6,158,237 | A * | 12/2000 | Riffat et al. | 165/92 |
| 2006/0007656 | A1 * | 1/2006 | Symons | 361/699 |

* cited by examiner

*Primary Examiner*—Ljiljana (Lil) V Ciric
(74) *Attorney, Agent, or Firm*—Daniel P. Morris

(57) ABSTRACT

A method and apparatus for improving the heat transfer from a semiconductor chip to its heat sinking device. The heat transfer device has a liquid chamber in which liquid is circulated within the chamber to spread the heat from one location of the chamber to the heat pipes partially mounted in the chamber. The heat is then carried away by the heat pipes to a remote heat sinking device. The chamber has built-in mechanism to allow the liquid to expand during normal operation and its expansion status to be monitored.

19 Claims, 4 Drawing Sheets

65 415 412 41 653 317 319 316 316 311 315 313 318 312 328 11 13 15 17 19 339

328
318
311
316
317
653
41
412
415
65
316
319
315
313
312
339
19
17
15
13
11

SEMICONDUCTOR CHIP HEAT TRANSFER DEVICE

FIELD OF THE INVENTION

The invention is directed to solve the heat dissipation problem of semiconductor chips. The invention is in the field of heat transfer and cooling of semiconductor chips used in the computer and telecommunication equipment.

BACKGROUND AND RELATION TO THE PRIOR ART

It is well known that the power and power density of semiconductor chips are increasing rapidly.

Because of this high power and power density, a great portion of the resistance of the heat flow is from the chip to the heat sinking device which usually has much larger size than the chip does. A better heat transfer device that can mitigate this thermal resistance and provide better heat transfer from a tiny chip to a heat sinking device is therefore desired.

U.S. Pat. No. 4,519,447-"Substrate Cooling" teaches two methods for cooling a substrate, one is a flat vapor chamber for heat spreading and the other is a magnetohydrodynamically driven liquid cooling plate.

U.S. Pat. No. 5,316,077-"Heat Sink for Electrical Circuit Components" teaches a method to form a coolant passages by means of two plates. A pump is used to drive the liquid coolant moving through the passages and carry the heat from the components to the fins on one plate. An expansion chamber is used to accommodate the expansion of the liquid coolant.

U.S. Pat. No. 6,019,165-"Heat Exchange Apparatus" teaches a method of using a centripetal pump impeller driven by an external magnetic field to move liquid coolant inside a thermal spreader plate and transfer heat from heat sources to heat absorber which is in good thermal contact with the thermal plate directly.

U.S. Pat. No. 6,029,742-"Heat Exchanger for Electronic Equipment" teaches a method using a magnetic coupled centrifugal rotor assembly in a pipe to drive the coolant within the pipe for removing heat from an electronic equipment.

SUMMARY OF THE INVENTION

The heat transfer device to be disclosed has a liquid chamber which is placed in good thermal contact with a semiconductor chip and has several heat pipes embedded inside the chamber. The other end of the heat pipes is protruded outside of the chamber and attached to heat sinks. The liquid inside the chamber is propelled to circulate within the chamber by rotating blades driven by an electric motor. The circulating liquid will carry heat from the hot side of the chamber which has microchannels embedded, to the heat pipes. The advantage of this idea is that the liquid chamber is self contained in a well defined area such that its quality can be ensured easily and hence much better leak proof in the products. A mechanism to allow the liquid to expand and contract as well as a method to detect the liquid leakage are also disclosed.

DESCRIPTION OF THE INVENTION

Figure 1:
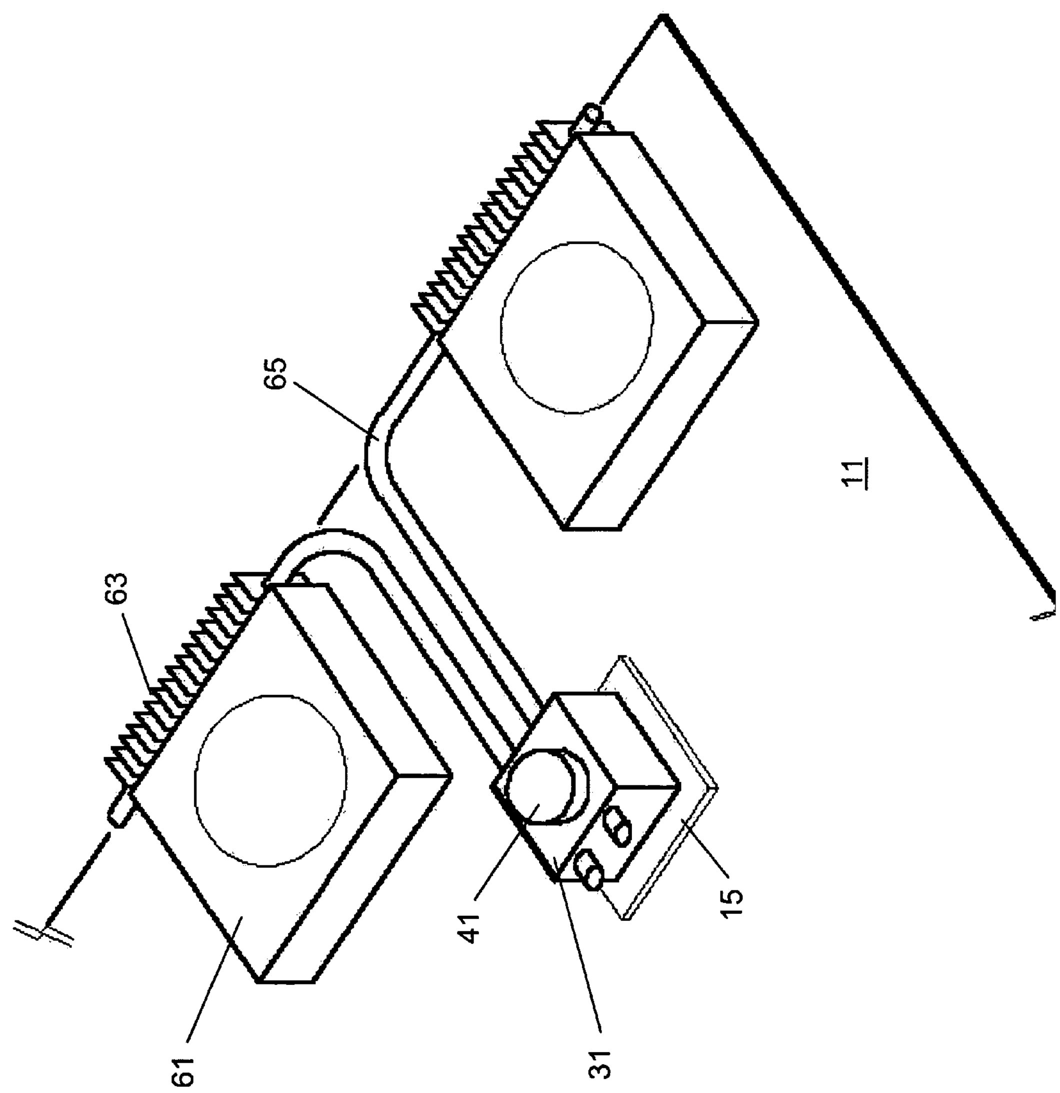
FIG. 1 The 3-D view of the heat transfer device with heat pipes and fan heat sink assemblies.

FIG. 1 shows the heat transfer device on a semiconductor chip package with its associated heat sinking assembly. The heat transfer device 31 is mounted on a semiconductor chip package 15.

The external motor 41 is placed on the top of the heat transfer device 31. One end of the two heat pipes 65 is inserted into the heat transfer device 31. The other end of the heat pipes 65 is attached to the heat sinks 63 which in turn in placed next to the fans 61. The air streams coming out from the fans 61 will be pushed through the heat sinks 63 and hence carry the heat away from the heat sinks 63.

Figure 2:
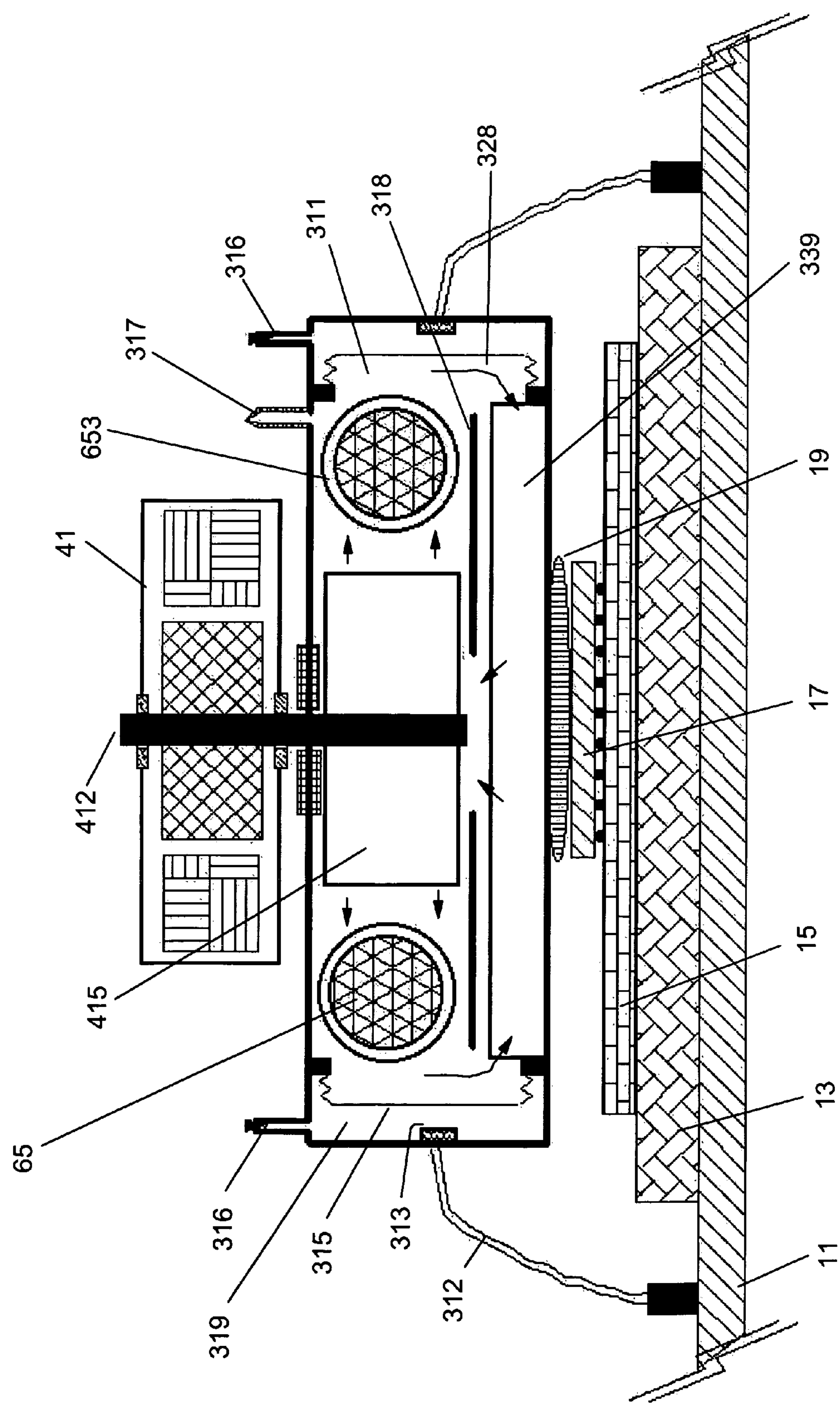
FIG. 2 The heat transfer device with motor mounted on the top.

The exemplified structure of the heat transfer device 31 is shown in FIG. 2. The heat transfer device 31 consists of a sealed chamber 311 in which liquid channel assembly 339 is placed on one side and one end of the heat pipes 65 are inserted therein. The rotating blades 415 are placed in the space above the center of the liquid channel assembly 339. A separator 318 that has an opening in the center is secured in between the blades 415 and the liquid channel assembly 339. The blades 415 are mounted on the motor shaft 412. The motor 41 which is a conventional electric motor is placed on the top of the heat transfer device 31. The sealing mechanism between the chamber wall and the rotating shaft is well known in the art and will not be described here. When the blades 415 are rotating, the liquid in the chamber 311 will be agitated and pushed to flow into the liquid channel assembly 339 from the area near the heat pipes 65 as indicated by the arrows 328. The liquid channel assembly 339 consists of a group of microchannels divided by channel walls. There are fins 653 mounted on the outside surface of the heat pipes 65 for better heat transfer from the liquid to the heat pipes. There are liquid fill port 317 and pressure relief valves 316 which is used as a safe guide to protect the heat transfer device 31. The device is further protected by the expandable bellows 315 and detectors 313. When the liquid inside the chamber 311 is heated up, its volume is likely expanded accordingly. As a result, it will force the expandable bellows to expand. The free air space 319 behind the bellows 315 is designed to have enough space to accommodate this expansion during normal operation. However, if the liquid temperature is much higher than the normal operating temperature, the expansion of the bellows 315 can be much bigger and may trigger the detectors 313. When the detectors 313 is triggered, a signal will be sent through the wires 312 to the outside monitoring circuitry and an appropriate remedy will be followed. Furthermore, the detectors 313 can detect the operating conditions of the heat transfer device 31. They can detect the volume as well as the temperature of the liquid by checking the air temperature and pressure in the air space 319 and the integrity of the chamber 311 by checking if there is liquid in the air space 319 because of leakage. The detection mechanism described here provides much better monitoring of the heat transfer device. If this detection mechanism fails, the traditional pressure relief valves will kick in and release the high-pressure vapor to protect the device. As shown in the figure, the heat transfer device is placed on top of a semiconductor chip 17 which is soldered on a substrate 15. The semiconductor chip package is then inserted into a socket 13 which is then soldered on a printed-wiring board 11.

Figure 3:
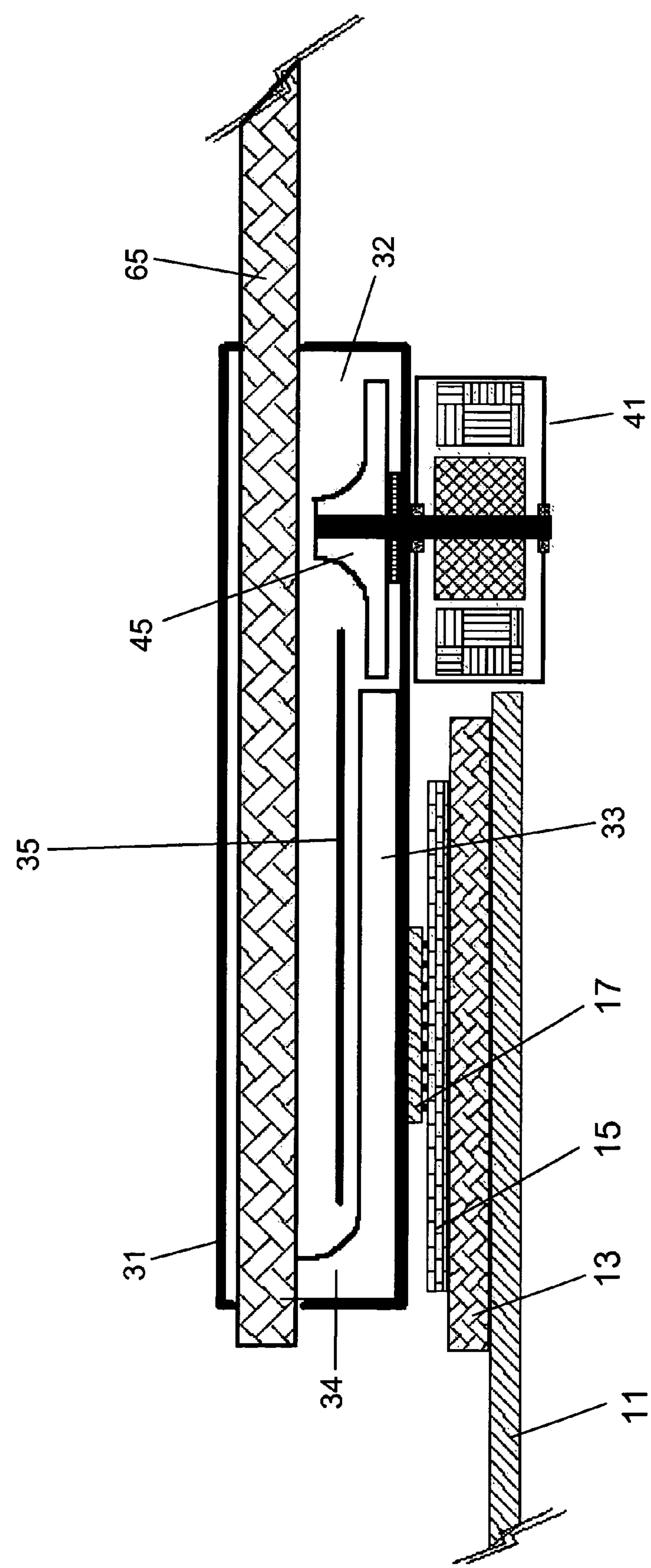
FIG. 3 The heat transfer device with motor mounted on the side.
Figure 4:
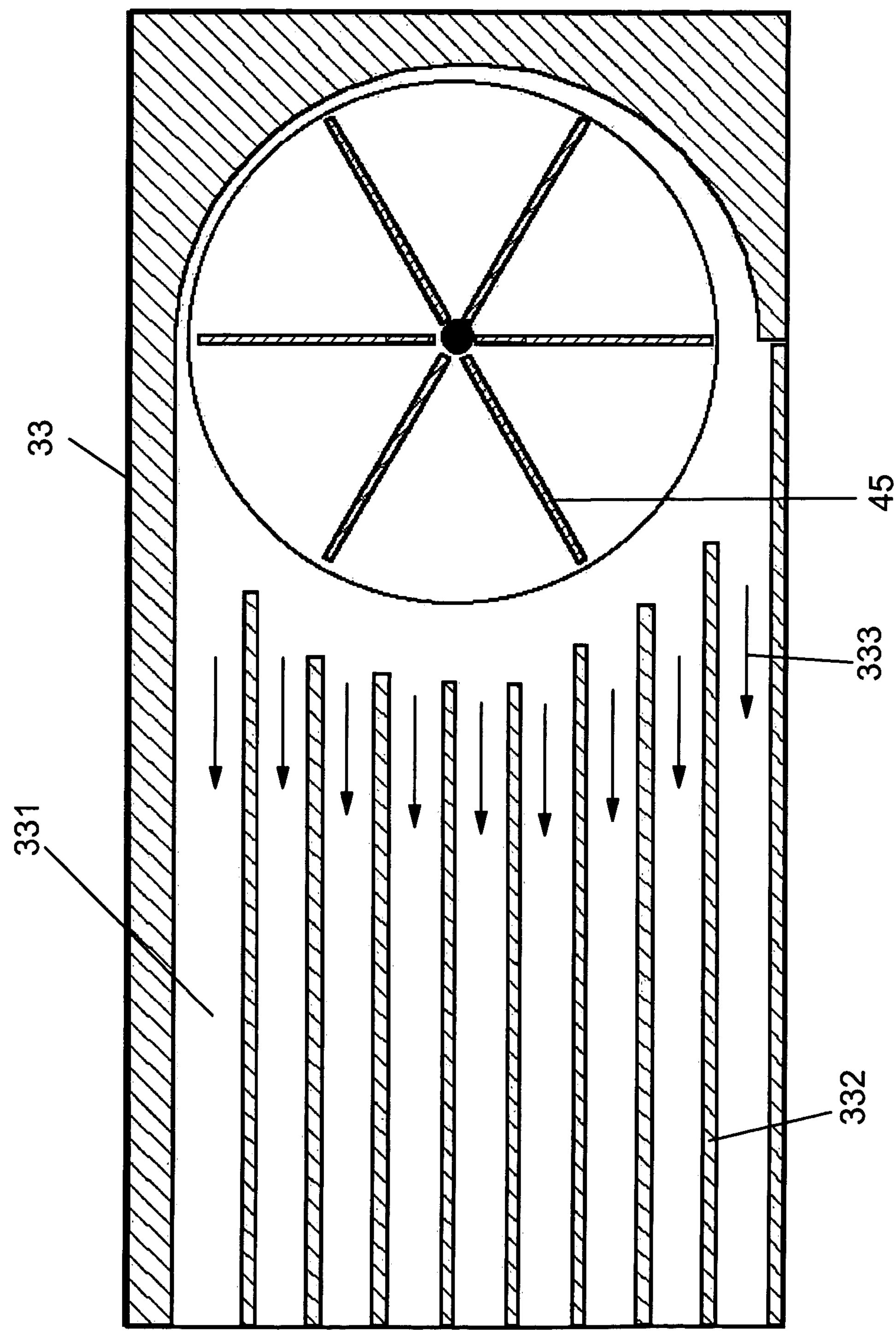
FIG. 4 The top view of the motor blades and the liquid channel assembly.

FIG. 3 shows another embodiment of the heat transfer device 31, in which the. external motor 41 is placed on the side of the device chamber 32. The liquid channel assembly 33 is on one side next to the rotating blades 45 in the chamber 32. There is a vertical section 34 at the end of the liquid channel assembly 33 to divert the liquid to the heat pipe 65. The heat pipe 65 can have an optional fins which is not shown in the figure for better heat transfer from liquid to the heat pipe 65. The separator 35 is used to separate the liquid flows. The exemplified liquid channel assembly 33 is shown in more details in FIG. 4. This is the top view of the liquid channel assembly under the separator 35. Liquid is pushed into the channels 331 which are divided by the channel walls 332. The arrows 333 depicted the flow direction of the liquid. Liquid is coming in from the center area near the shaft of the blades and is pushed out to the channels 331 by the centrifugal forces generated from the rotating blades 45. The liquid channels can be part of the chamber wall or a separate entity soldered or brazed on the inner surface of the chamber wall.

For the purposes of clarity, only major components are drawn in these figures and they are not drawn to scale.

The invention claimed is:

1. A heat transfer device comprising:

a liquid chamber;

a plurality of microchannels forming a liquid channel assembly within said liquid chamber;

a plurality of rotating blades;

an external motor;

a separator; and a plurality of heat pipes within said liquid chamber.

2. The heat transfer device according to claim 1 wherein said liquid chamber is filled with a heat transfer fluid and said plurality of rotating blades are driven by said external motor to circulate said fluid within said chamber.

3. The heat transfer device according to claim 1 wherein plurality of microchannels are formed by a plurality of channel walls.

4. The heat transfer device according to claim 3 wherein said liquid channel assembly is selected from the group consisting of being a part of a wall of said liquid chamber and a separate unit bonded on an inner surface of said liquid chamber.

5. The heat transfer device according to claim 3 wherein said liquid channel assembly is located in an inner wall of said liquid chamber to which heat is applied from outside of said inner wall.

6. The heat transfer device according to claim 1 wherein each of said plurality of heat pipes are partially inserted into said liquid chamber and another end of one end of each of said plurality of heat is attached to a heat sink.

7. The heat transfer device according to claim 1 wherein said plurality of heat pipes comprise heat transfer fins on a perimeter of at least a portion of said plurality of heat pipes within said liquid chamber.

8. The heat transfer device according to claim 1 wherein said liquid chamber has liquid circulating within said liquid chamber to carry heat released from said liquid channel assembly to said plurality of heat pipes.

9. The heat transfer device according to claim 1 wherein said liquid chamber comprises a bellows structure that is expandable under pressure created by said liquid within said liquid chamber.

10. The heat transfer device according to claim 9 wherein said structure bellows comprises a smaller sealed sub-chamber within said liquid chamber.

11. The heat transfer device according to claim 10 wherein said sub-chamber and said liquid chamber form an air space.

12. The heat transfer device according to claim 10 wherein said air space comprises an electronic detector for checking the temperature and pressure of the air within said air space.

13. The heat transfer device according to claim 12 wherein said detector functions to check and detect said bellows structure when said bellows are touching said detector.

14. The heat transfer device according to claim 12 wherein said detector functions to check and detect an amount of liquid leaked out from said sub-chamber.

15. The heat transfer device according to claim 12 wherein said detector comprises wires connected to an outside monitoring circuitry.

16. The heat transfer device according to claim 1 wherein said liquid chamber comprises a pressure relief valve.

17. The heat transfer device according to claim 1 wherein said liquid chamber comprises a liquid fill port.

18. The heat transfer device according to claim 1 wherein said liquid chamber is made of heat transfer materials selected from the group consisting of aluminum and copper.

19. A heat transfer device comprising:

a liquid chamber;

a plurality of microchannels forming a liquid channel assembly within said liquid chamber;

a plurality of rotating blades;

an external motor;

a separator;

a plurality of heat pipes within said liquid chamber;

said liquid chamber being filled with a heat transfer fluid and said plurality of rotating blades being driven by said external motor to circulate said fluid within said chamber;

said liquid channel assembly being located in an inner wall to which heat is applied from outside of said inner wall;

each of said plurality of heat pipes having one end partially inserted into said liquid chamber and another end of each of said plurality of heat pipes attached to a heat sink;

said plurality of heat pipes comprising heat transfer fins on a perimeter of at least a portion of said plurality of heat pipes within said liquid chamber;

said liquid chamber having liquid circulating within said liquid chamber to carry heat released from said liquid channel assembly to said plurality of heat pipes;

said liquid chamber comprises a bellows structure that is expandable under pressure created by said liquid within said liquid chamber;

said structure comprises a sealed and smaller sub-chamber within said liquid chamber;

said sub-chamber and said liquid chamber forming an air space;

said air space comprising an electronic detector for checking the temperature and pressure of the air within said air space;

said detector functioning to check and detect said structure when said bellows are touching said detector;

said detector functioning to check and detect an amount of liquid leaked out from said sub-chamber;

said detector comprising wires connected to an outside monitoring circuitry;

said liquid chamber comprising a pressure relief valve; and said liquid chamber comprising a liquid fill port.

* * * * *